US010658054B2

(12) United States Patent
Ioannou et al.

(10) Patent No.: US 10,658,054 B2
(45) Date of Patent: May 19, 2020

(54) METHODS FOR READ THRESHOLD VOLTAGE SHIFTING IN NON-VOLATILE MEMORY

(71) Applicant: International Business Machines Corporation, Armonk, NY (US)

(72) Inventors: Nikolas Ioannou, Zurich (CH);
Charalampos Pozidis, Thalwil (CH);
Nikolaos Papandreou, Thalwil (CH);
Roman Alexander Pletka, Uster (CH);
Sasa Tomic, Kilchberg (CH); Aaron D. Fry, Richmond, TX (US); Timothy Fisher, Cypress, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/109,689

(22) Filed: Aug. 22, 2018

(65) Prior Publication Data

US 2020/0066361 A1 Feb. 27, 2020

(51) Int. Cl.
*G11C 16/34* (2006.01)
*G06F 3/06* (2006.01)
(Continued)

(52) U.S. Cl.
CPC ........ *G11C 16/3427* (2013.01); *G06F 3/0604* (2013.01); *G06F 3/0659* (2013.01);
(Continued)

(58) Field of Classification Search
CPC .. G11C 16/3427; G11C 16/26; G11C 16/0483
See application file for complete search history.

(56) References Cited

U.S. PATENT DOCUMENTS 8,830,762 B2 9/2014 Shen et al.
8,942,037 B2 1/2015 Kia et al.
(Continued)

OTHER PUBLICATIONS

Jaeyong Jeong, et al., Lifetime Improvement of NAND Flash-Based Storage Systems Using Dynamic Program and Erase Scaling, Proceedings of the 12th USENIX Conference on File and Storage Technologies (FAST '14), Feb. 17-20, 2014, pp. 61-74.
(Continued)

*Primary Examiner* — Han Yang
(74) *Attorney, Agent, or Firm* — Daniel P. Morris; Otterstedt, Wallace & Kammer, LLP

(57) ABSTRACT

A method for optimizing a read threshold voltage shift value in a NAND flash memory may be provided. The method comprises selecting a group of memory pages, determining a current threshold voltage shift (TVS) value, and determining a negative and a positive threshold voltage shift offset value. Then, the method comprises repeating a loop process comprising reading all memory pages with different read TVS values, determining maximum raw bit error rates for the group of memory pages, determining a direction of change for the current TVS value, determining a new current TVS value by applying a function to the current TVS value using as parameters the current threshold voltage, the direction of change and the positive and the negative TVS value, until a stop condition is fulfilled such that a lowest possible number of read errors per group of memory pages is reached.

9 Claims, 8 Drawing Sheets

(51) Int. Cl.
*G06F 11/07* (2006.01)
*G11C 16/26* (2006.01)
*G11C 16/04* (2006.01)

(52) U.S. Cl.
CPC .......... *G06F 3/0679* (2013.01); *G06F 11/073* (2013.01); *G06F 11/076* (2013.01); *G11C 16/26* (2013.01); *G11C 16/0483* (2013.01)

(56) References Cited

U.S. PATENT DOCUMENTS

| | | |
|---|---|---|
| 9,251,909 B1 | 2/2016 | Camp et al. |
| 9,437,316 B2 | 9/2016 | Koudele |
| 9,583,205 B2 | 2/2017 | Camp et al. |
| 2014/0258796 A1* | 9/2014 | Ghaly ................ G01R 31/3171 714/708 |
| 2016/0110248 A1 | 4/2016 | Camp |
| 2017/0358346 A1* | 12/2017 | Zhang .................. G11C 16/349 |
| 2019/0065331 A1* | 2/2019 | Singidi ............... G06F 11/1068 |

OTHER PUBLICATIONS

Christian Monzio Compagnoni, et al., Investigation of the Threshold Voltage Instability After Distributed Cycling in Nanoscale NAND Flash Memory Arrays, Published in: Reliability Physics Symposium (IRPS), 2010 IEEE International, Date of Conference: May 2-6, 2010 published at URL: http://ieeexplore.ieee.org/document/5488762 on Jun. 17, 2010, 3 pages.

* cited by examiner

METHODS FOR READ THRESHOLD VOLTAGE SHIFTING IN NON-VOLATILE MEMORY

BACKGROUND

The invention relates generally to a method for optimizing the usage of flash memory systems, and more specifically, to a method for optimizing a read threshold voltage shift value in a NAND flash memory. The invention relates further to a related memory controller for optimizing a read threshold voltage shift value for a NAND flash memory, and a computer program product.

Enterprise storage capacity requirements are growing consistently. At the same time, prices for flash storage have decreased significantly in comparison to hard disk drive storage systems so that the demand for NAND flash-based memory has increased significantly. The cell density of such NAND flash memories is also ever-increasing and, the number of bits storable per cell is also increasing—e.g. TLC (triple level cell).

In NAND flash memories, cells are typically organized by word-lines and bit-lines into blocks. Currently, a block may have about 10,000,000 cells. The cells can be programmed as single-level cells (SLCs with one bit per cell) or multi-level cells (MLCs, at least two bits per cell). Using an SLC cell, as example, the threshold voltage determines whether a read-back voltage from a NAND cell is a 0 or a 1. If the read-back voltage is below the threshold voltage, it is decided that a logical "0" has been stored in the cell; if the read-back voltage is above the threshold voltage, it is decided that a logical "1" has been stored in the cell. However, if the number of levels in a single cell increases, a more precise threshold voltage determination is required for programming and read-back of data stored in the cells. This finer threshold voltage determination or setting makes MLCs prone to noise.

The raw bit error rate (RBER) of a flash memory block typically increases over time due to additional program and erase (P/E) cycling, charge leakage from retention and, read disturb errors. Typically, a flash memory block may be retired when a page in the block exhibits read errors that cannot be corrected by the error correction code (ECC) that is present at the flash memory controller.

The threshold voltage (VTH) is the voltage above which the cell conducts and depends on the amount of charge stored in the cell, read threshold voltage shifting, is used in block calibration to determine the optimal read threshold voltage shift values. In some prior art, read threshold voltage shift values are also known as threshold voltage shift (TVS) values. Block calibration is an effective method to reduce the number of read errors and, thus, to prolong endurance and retention for enterprise-level storage systems using NAND flash memories. Block calibration is normally periodically performed as part of an automated low-speed and low-priority background health check process, so as not to adversely impact user read or write operations. The improvement in endurance is achieved by setting the optimal threshold voltage shift (TVS) values at the granularity of groups of pages per block that result in minimizing the maximum raw bit error rate of each flash block.

This background setting of optimal TVS values relies on RBER rates observed during background reads and it stores a determined TVS value in metadata storage for a particular cell group. This basic background approach has been proven to work well in lateral (2-D) NAND flash memory devices. However, the recent proliferation of 3D NAND flash memory devices has introduced new distortion mechanisms that affect the RBER of flash memory pages and blocks in different ways than before. Notably, 3D flash memory exhibits an abrupt change in optimal voltage thresholds when switching from a P/E cycling phase to a retention phase, or due to a read disturb effect. The change in VTH is monotonically increasing with a number of P/E cycles—i.e., before retention or read disturb—that the block has seen, and is much more pronounced than in 2D flash memories.

As a result of the abrupt VTH change in 3D flash memories, the threshold-voltage shifting algorithm known in the art are not adequate any longer. Specifically, such algorithms are not flexible enough to track rapid changes in VTH due to retention or read disturb. Modifications to existing schemes are required in order to make also 3D flash memory reliable and durable. At the same time, it should be ensured that no unnecessary latencies and read bandwidth penalties are introduced.

SUMMARY

According to one aspect of the present invention, a method for optimizing a read threshold voltage shift value in a NAND flash memory may be provided. The method may comprise selecting a group of at least one memory pages, each of the memory pages comprising a plurality of memory cells, determining a current threshold voltage shift value (gTVS), and determining a positive threshold voltage shift offset value ($\Delta 1$) and a negative threshold voltage shift offset value ($\Delta 2$).

The method may further comprise repeating a loop process. The loop process may comprise reading all memory pages in the selected group with read threshold voltage shift values of gTVS, gTVS+$\Delta 1$, gTVS+$\Delta 2$, and determining for each of the read threshold shift values the maximum raw bit error rates for the group of memory pages being read. Furthermore, the method may comprise determining a direction of change for the current threshold voltage shift value using the maximum raw bit error rates obtained from reading the memory pages in the selected group with the read threshold voltage shift values gTVS, gTVS+$\Delta 1$, and gTVS+$\Delta 2$, as well as, determining a new current threshold voltage shift value by applying a function to the current threshold voltage shift value using as parameters the current threshold voltage, the direction of change and the positive threshold voltage shift value, and the negative threshold voltage shift value.

The loop process may continue until a stop condition is fulfilled such that the optimizing a read threshold voltage shift value is determined to generate a lowest possible number of read errors per group of memory pages.

According to another aspect of the present invention, a memory controller for optimizing a read threshold voltage shift value for a NAND flash memory may be provided.

The memory controller may comprise a selection unit adapted for selecting a group of at least one memory pages, each of the memory pages comprising a plurality of memory cells, a first determination unit adapted for determining a current threshold voltage shift value (gTVS), and a second determination unit determining a positive threshold voltage shift offset value ($\Delta 1$), and a negative threshold voltage shift offset value ($\Delta 2$).

Furthermore, the memory controller may comprise a loop control unit adapted for controlling a read module, a first determination module, a second determination module and a third determination module until a stop determination unit adapted for receiving a stop condition trigger is triggered.

Thereby, the read module may be adapted for reading all memory pages in the selected group with read threshold voltage shift values of gTVS, gTVS+Δ1, gTVS+Δ2.

The first determination module may be adapted for determining for each of the read threshold shift values the maximum raw bit error rates for the group of memory pages being read, and adapted for determining a direction of change for the current threshold voltage shift value using the maximum raw bit error rates obtained from reading the memory pages in the selected group with the read threshold voltage shift values gTVS, gTVS+Δ1, and gTVS+Δ2.

Additionally, the second determination module may be adapted for determining a direction of change for the current threshold voltage shift value using the maximum raw bit error rates obtained from reading the memory pages in the selected group with the read threshold voltage shift values gTVS, gTVS+Δ1, and gTVS+Δ2, and the third determination module may be adapted for determining a new current threshold voltage shift value by applying a function to the current threshold voltage shift value using as parameters the current threshold voltage, the direction of change and the positive threshold voltage shift value and the negative threshold voltage shift value, such that the optimizing the read threshold voltage shift value may be determined to generate a lowest possible number of read errors per group of memory pages.

Furthermore, embodiments may take the form of a related computer program product, accessible from a computer-usable or computer-readable medium providing program code for use, by, or in connection, with a computer or any instruction execution system. For the purpose of this description, a computer-usable or computer-readable medium may be any apparatus that may contain means for storing, communicating, propagating or transporting the program for use, by, or in connection, with the instruction execution system, apparatus, or device.

BRIEF DESCRIPTION OF THE DRAWINGS

It should be noted that embodiments of the invention are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
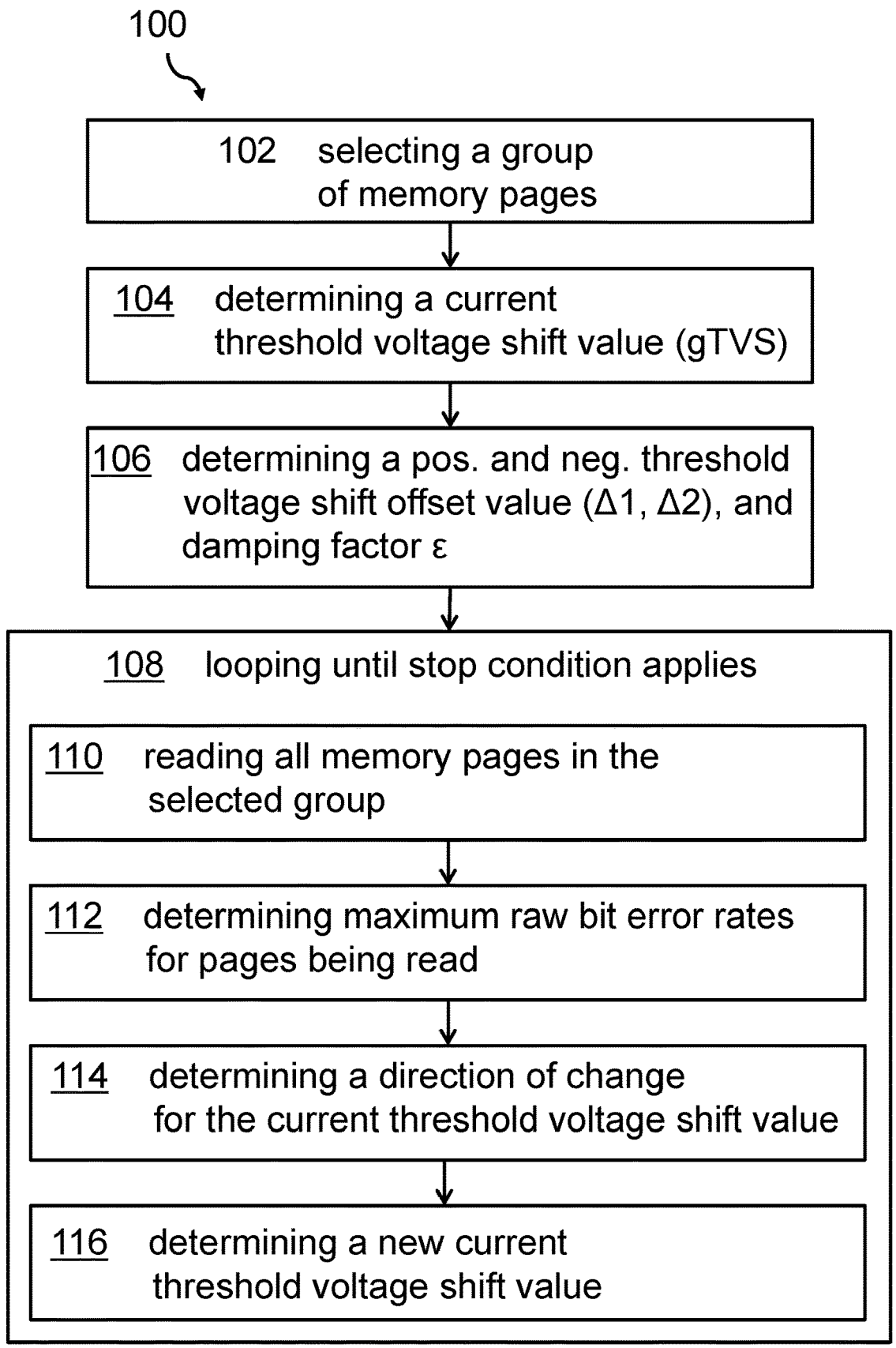

Preferred embodiments of the invention will be described, by way of example only, and with reference to the following drawings:

FIG. 1 shows a block diagram of an embodiment of the inventive method for optimizing a read threshold voltage shift value in a NAND flash memory.

Figure 2:
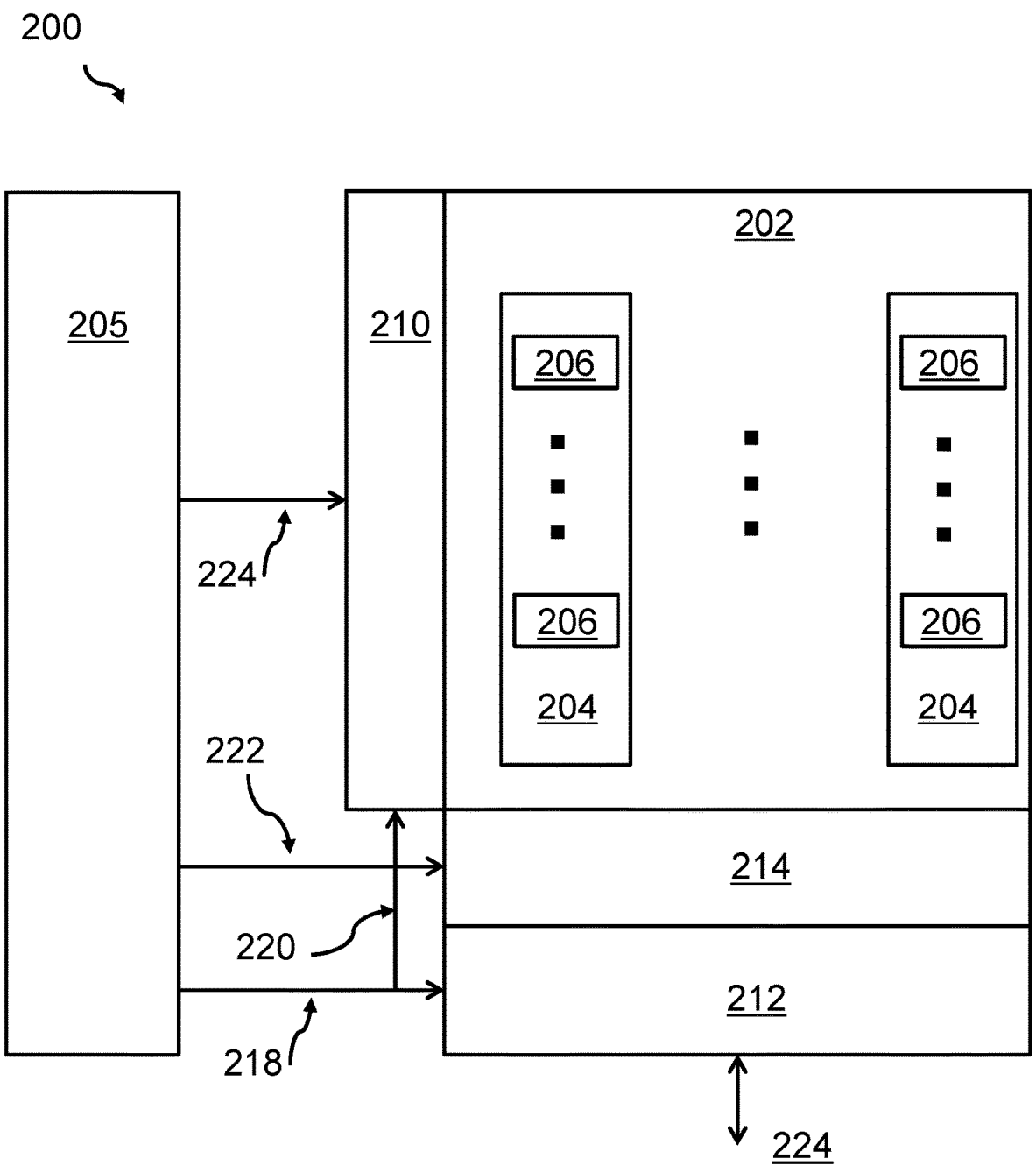

FIG. 2 shows a block diagram of an exemplary flash memory module that can be utilized to implement the proposed concept.

Figure 3:
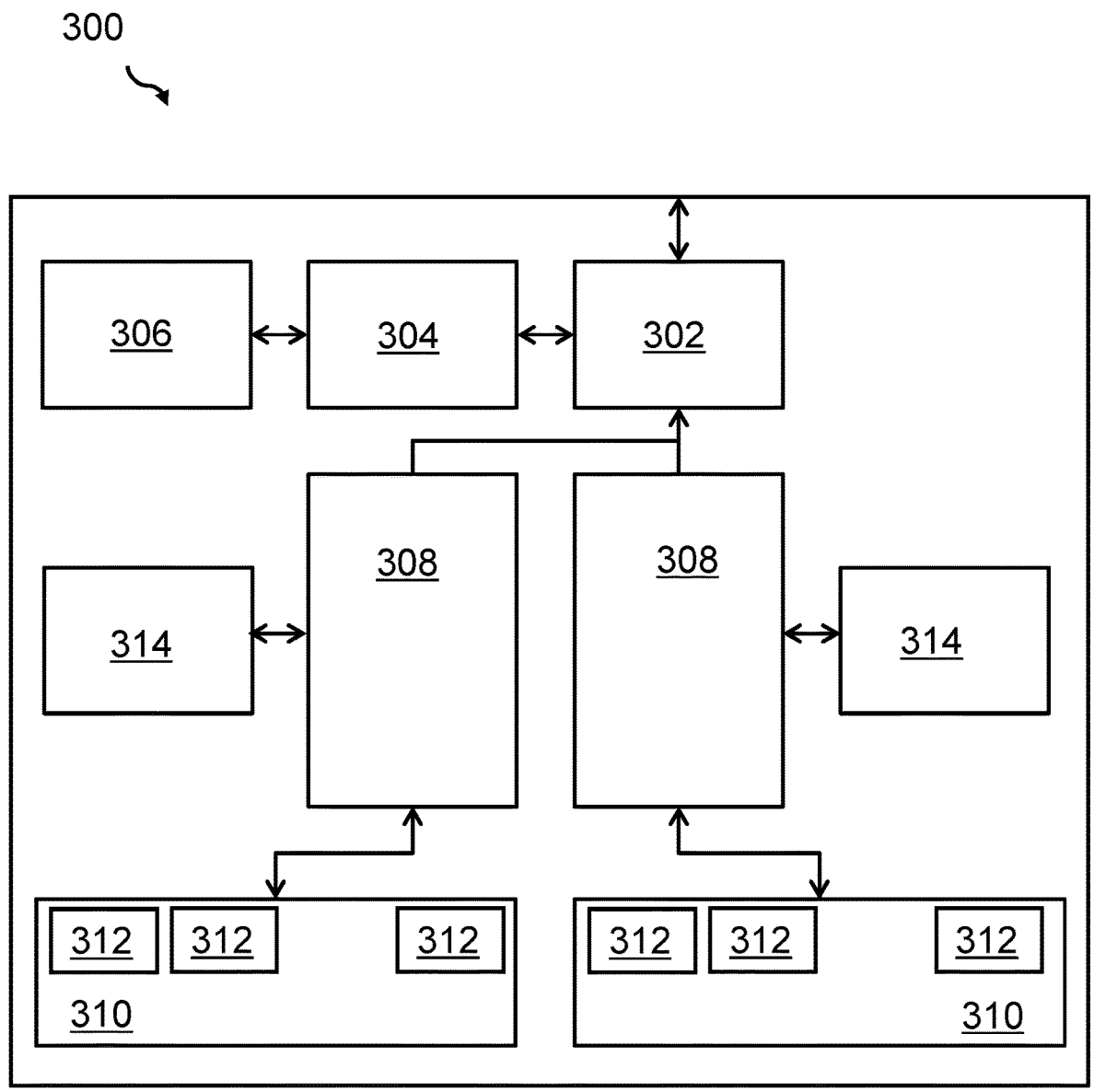

FIG. 3 shows a block diagram of a flash card used in a data storage system.

Figure 4:
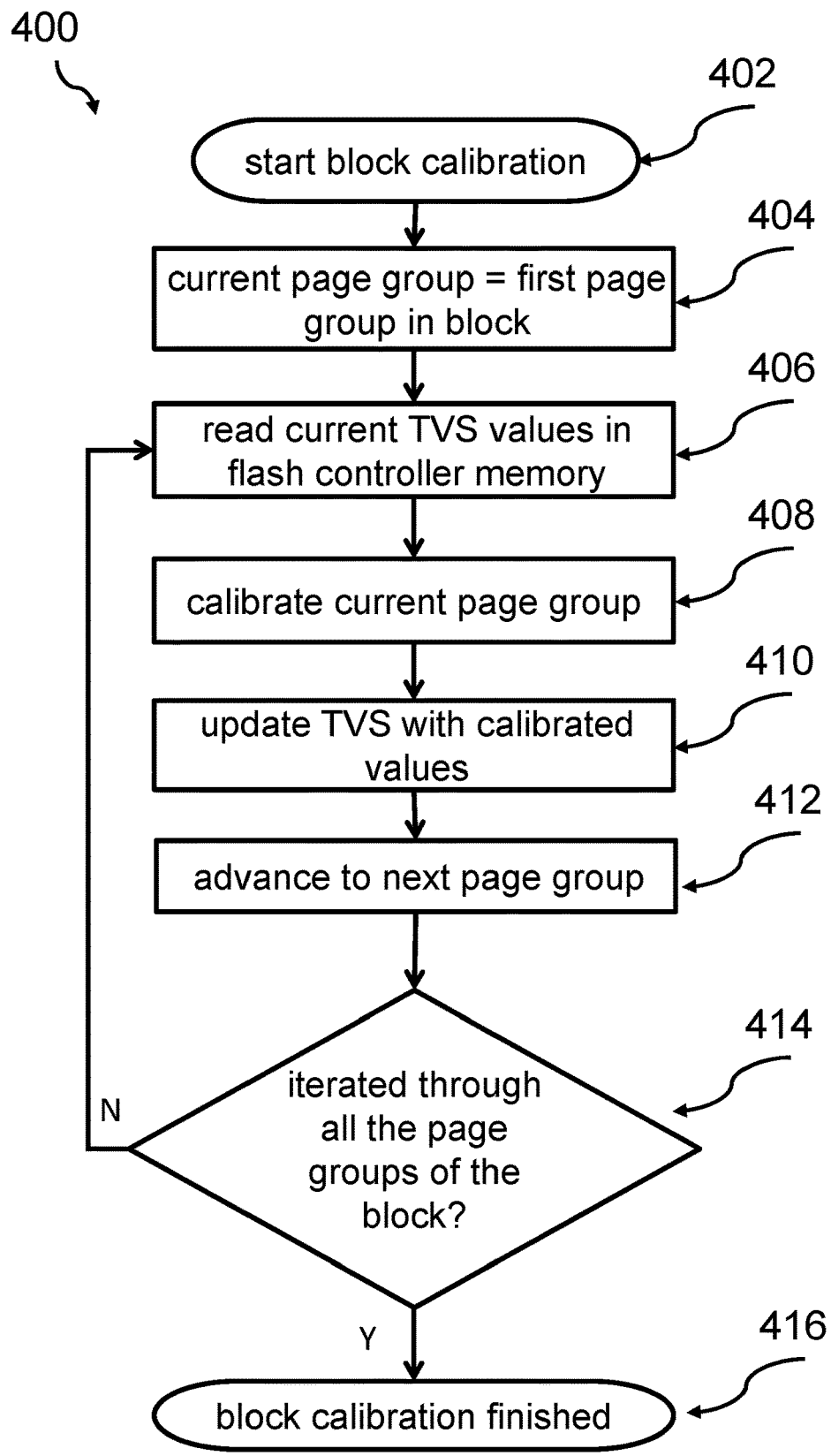

FIG. 4 shows a block diagram of another high-level flow chart of an embodiment of the proposed method.

Figure 5:
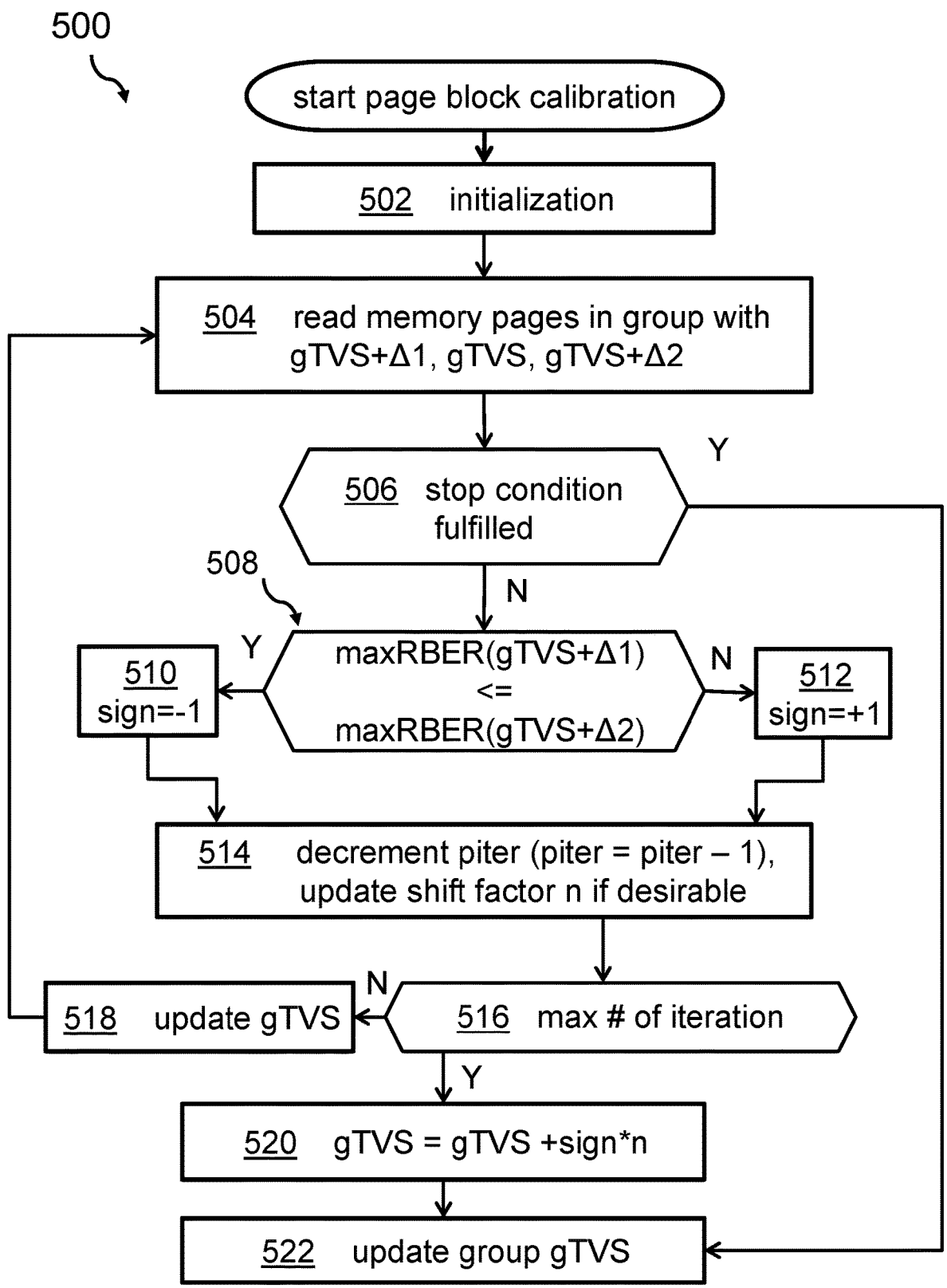

FIG. 5 shows a block diagram of a more implementation-near flow chart of an embodiment of the proposed method.

Figure 6:
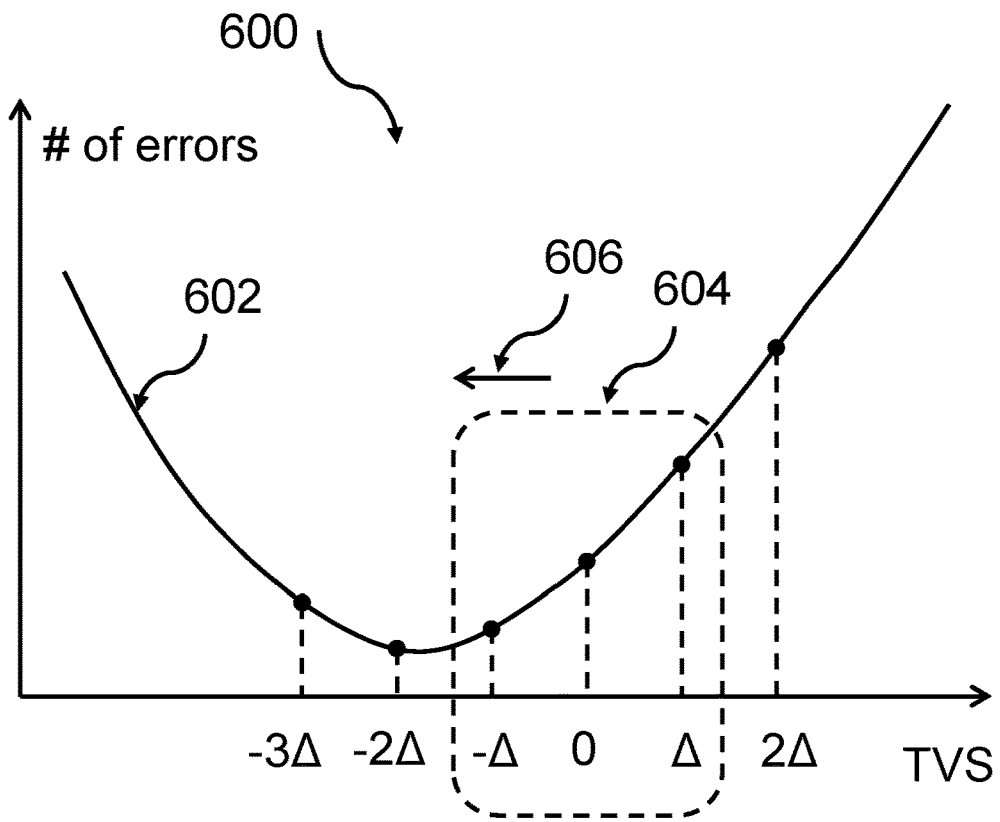

FIG. 6 shows a diagram of a non-optimized read threshold voltage shift value depending on the number of related read errors.

Figure 7:
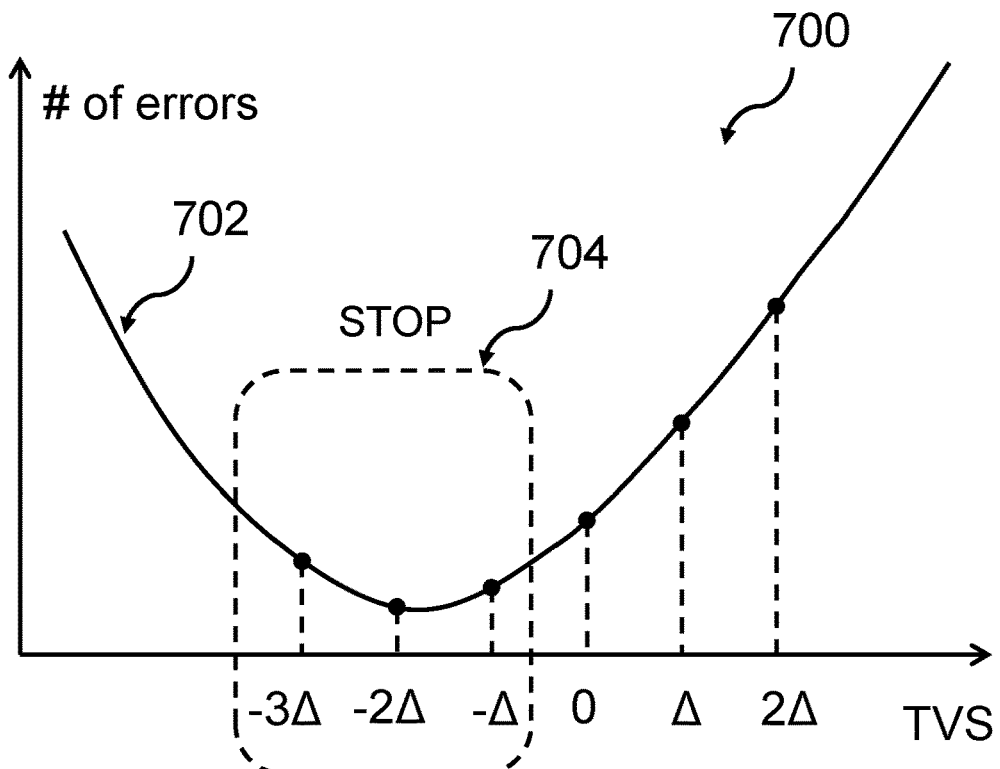

FIG. 7 shows a diagram of an optimized read threshold voltage shift value.

Figure 8:
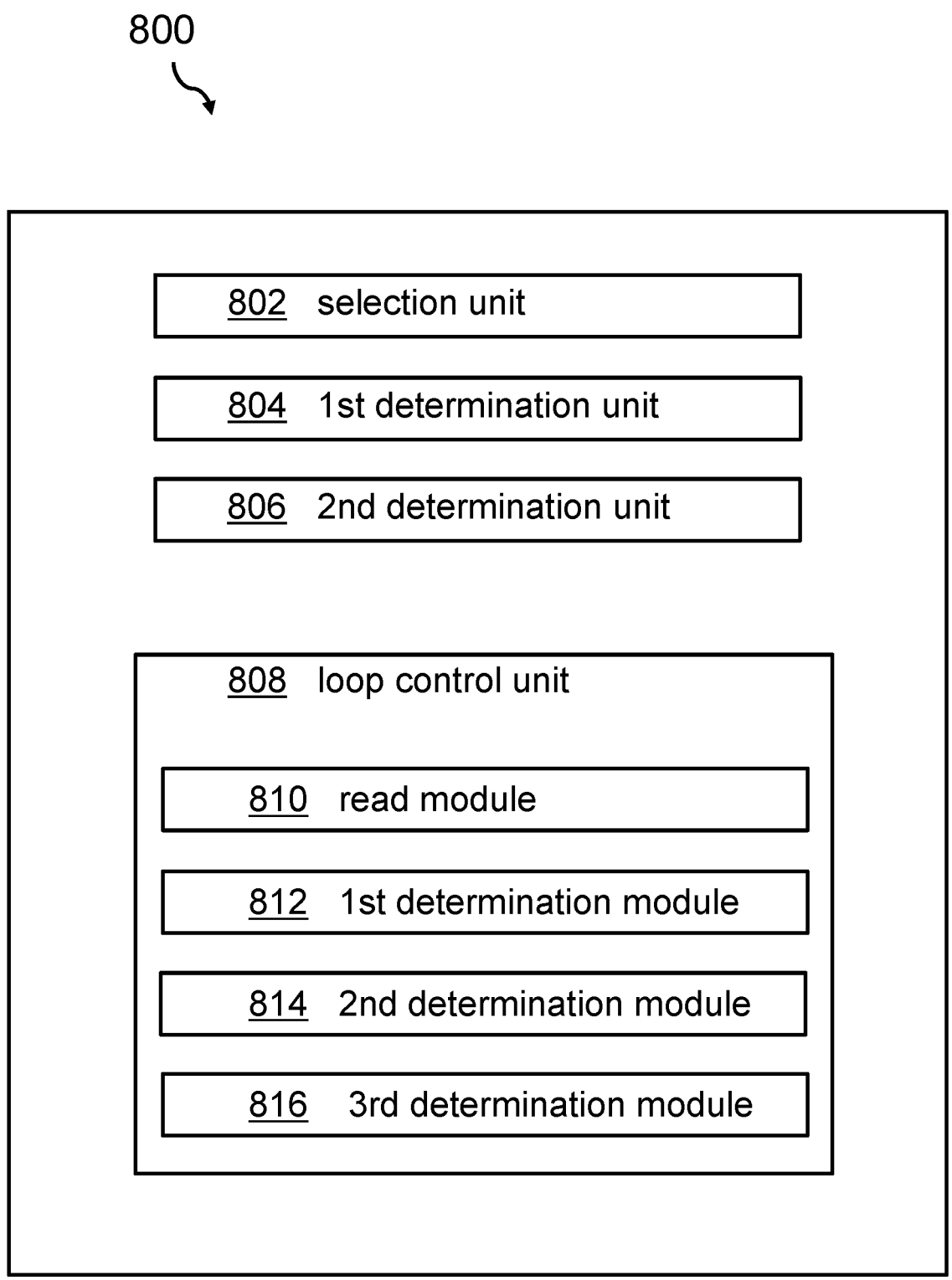

FIG. 8 shows a block diagram of an embodiment of the inventive memory controller for optimizing a read threshold voltage shift value for a NAND flash memory.

Figure 9:
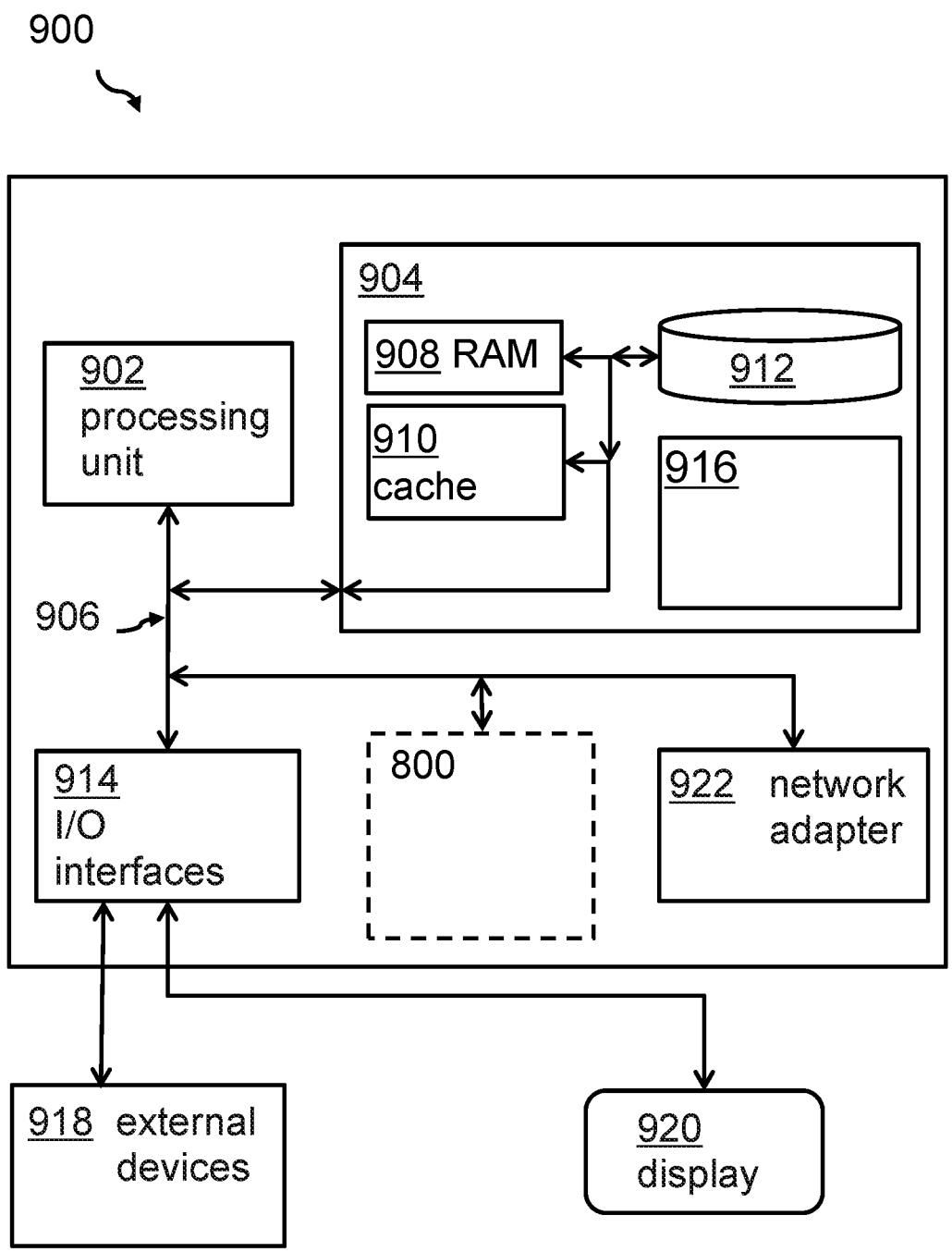

FIG. 9 shows a block diagram of a computing system including the memory controller according to FIG. 3 or FIG. 8.

DETAILED DESCRIPTION

In the context of this description, the following conventions, terms and/or expressions may be used:

The term 'read threshold voltage shift value' may denote here a voltage value by which logical statuses may be read out of a 3D NAND flash memory cell. The threshold voltage (VTH) is the voltage above which the cell conducts and depends on the amount of charge stored in the cell. Read threshold voltage shifting is used in block calibration to determine the optimal read threshold voltage shift values. Block calibration may represent an effective method to reduce the number of read errors in the memory cells and, thus, to prolong endurance and retention for enterprise-level storage systems using NAND flash memories. The process of block calibration is normally performed as part of an automated background health check process, so as not to adversely impact user read or write operations. The background health check process may not be part of the normal operation—i.e., read and/or write of active data bits to memory cells—but may be performed outside the active usage of the memory cells during maintenance phases for the memory system.

The improvement in endurance of the memory cells may be achieved by setting the optimal threshold voltage shift (TVS) values at the granularity of groups of pages per block that result in minimizing the maximum raw bit error rate of each flash block.

The term 'joint threshold voltage shift value' may denote that the negative threshold voltage shift offset value, and the positive threshold voltage shift offset value have the same nominal (or absolute values) value. Thus, it may be required to differentiate between different nominal values. The proposed algorithm may become a bit easier to handle.

The term 'NAND flash memory' may denote—in contrast to a NOR flash memory—an electronic (solid-state) non-volatile computer storage medium that can be electrically erased and reprogrammed. NAND flash also uses floating-gate transistors, and they are connected in a way that resembles a NAND gate: several transistors may be connected in series, and the bit line is pulled low only if all the word lines are pulled high (above the transistors' $V_T$). These groups are then connected via some additional transistors to a NOR-style bit line array in the same way that single transistors are linked in NOR flash memory systems. Compared to NOR flash, replacing single transistors with serial-linked groups may add an extra level of addressing. Whereas NOR flash might address memory by page then word, NAND flash might address it by page, word and bit. They additional prefix '3D' (three-dimensional) may denote the fact that the individual memory cells are oriented vertically instead of horizontally/planar in a wafer/substrate. This may enable a higher density of memory cells.

To read data, first the desired group is selected (in the same way that a single transistor is selected from a NOR array). Next, most of the word lines are pulled up above the $V_T$ of a programmed bit while one of them is pulled up to just over the $V_T$ of an erased bit. The series group will conduct (and pull the bit line low) if the selected bit has not been programmed.

The term 'memory page' may denote a group of memory cells that may be addressed as one group in case of 3D NAND memory in the sense of the above paragraph.

The term 'memory cells' may denote here an electronic circuitry—basically a floating-gate transistor—being able to store one or bore bits. Experts differentiate between single level cells (SLC) and multiple level cells (MLC) which may suggest that more than one bit per cell is storable. In practice, the term MLC may very often be used for memory flash cells adapted for storing two bits per cell—i.e., per floating gate transistor. Other forms are TLC (three level cell) and QLC (quad level cell).

The use of a singular term, such as, but not limited to, 'a' is not intended as limiting of the number of items. In particular, the term 'read threshold voltage shift value' is not limited to a single value. For example, in a NAND flash memory using TLC, a shared physical page includes a lower, upper, and extra page. The number of read threshold voltage shift values may correspond to a single value for lower, two values for upper, and four values for extra pages. It should be understood that depending on the page type, one or more read threshold voltage shift values have to be optimized, where all values can be optimized at the same time or independent from each other without departing from the spirit and scope of the invention.

The term 'threshold delta value' may denote a voltage value, and in particular its change over time, required to identify a stored bit in a cell of a NAND flash memory. The threshold delta value may be added to a base read threshold voltage value. The term delta may also be denoted as offset.

The term 'raw bit error rate' may denote a bit error rate of a respective 3D NAND memory cell—or a page of such memory cells—without applied error correction processes performed. The term 'maximum raw bit error rate' may denote the maximum of those raw bit error rates from a plurality of memory pages read out at the same time with the same TVS. It is a common effect that in flash memory the raw bit error rate increases over time due to additional program and erase (P/E) cycling, charge leakage from retention and, read disturb errors. A typical treatment for a page with a too high raw bit error rate may be a retirement of such a page or a retirement of the affected block. Also, when a page in the block exhibits read errors that cannot be corrected by the error correction code (ECC) that is present at the flash memory controller, the page may no longer be used—i.e., retired.

The term 'direction of change' may denote the mathematical sign of a change in the VTH. This may be positive or negative. One may speak of a right shift in case the TVS may shift to a higher value (to the right of the x-axis of an x/y diagram) and a left shift in case the VTH may to a lower value (to the left of the x-axis of an x/y diagram).

The term 'new current threshold voltage shift value' may denote a newly determined VTH in order for a proper read-out of bit of cells in a 3D NAND flash memory system. This value may be used for current and future read-outs of memory cells.

The proposed method for optimizing a read threshold voltage shift value in a NAND flash memory may offer multiple advantages and technical effects:

The increased sensitivity to changes in threshold voltage values, as specifically 3D flash memory and/or MLCs can be addressed successfully with the proposed calibration scheme for the read threshold voltage shift values. The proposed calibration method is capable of tracking the optimal or near-optimal VTH at all times, i.e., in periods of both, abrupt as well as smooth VTH changes. The proposed method may also exhibit low latency, as it concurs, only a small number of page reads on average. It is also able trading robustness with performance, and thus, providing flexibility to the controller architect to tune according to the controller design objectives.

Additionally, the proposed calibration method may operate on a dynamic set of iterations over sliding windows of TVS values that shift depending on the number of read errors of a current iteration.

Furthermore, the proposed calibration method may also introduce a damping factor that may enable avoiding unnecessary TVS changes and background calibration reads if the error rate between calibration reads is relatively small.

In the following, additional embodiments of the method—which are also applicable to the related memory controller for optimizing a read threshold voltage shift value for a NAND flash memory—will be described:

According to one advantageous embodiment of the method, the stop condition may be fulfilled if the maximum raw bit error rate of all selected pages read with gTVS is smaller than a damping factor c plus the maximum raw bit error rate of all selected pages read with gTVS+$\Delta 2$, or the maximum raw bit error rate of all selected pages read with gTVS is smaller than the c value plus the maximum raw bit error rates for gTVS+$\Delta 1$. In either case, the new current gTVS may be assumed to be optimized. The small c value may help to interrupt the optimization process for the new current gTVS at a sensitive level without increasing the overhead too much. The approach taken may be understood as an optimization which is "good enough". The smaller the c value may be predefined, the longer the iteration process may continue before the stop condition may apply.

According to one useful embodiment of the method, a joint threshold voltage shift offset may correspond to the positive threshold voltage shift offset $\Delta 1$ and the negative of the negative threshold voltage shift offset $\Delta 2$. This is actually the case if the nominal value of the negative threshold voltage shift offset $\Delta 2$ and the positive threshold voltage shift offset $\Delta 2$ have the same absolute value. This may make the underlying method a little bit easier to maintain and the number of individual variables may be reduced. A related process may also be streamlined.

According to one permissive embodiment of the method, the loop process may also comprise incrementing a loop counter for every loop iteration, and the stop condition may be fulfilled of a maximum number of loop iterations has been executed. This way the overhead operation in the memory system may be controlled and limited to a maximum allowed number of iteration cycles.

According to an advantageous embodiment of the method, a read operation of a memory page is skipped when the memory page has been read with the same threshold voltage shift values in a previous iteration, and the raw bit error rate from the previous read with the same threshold voltage shift values is used. This option may increase the performance of the underlying memory system.

According to another preferred embodiment of the method, the threshold delta value may be increased by a factor equivalent to the number of loop iterations for every new iteration. Thus, a linear dependency may be used between the number of iterations and the threshold shift value.

According to a further advantageous embodiment of the method, the negative threshold voltage shift offset may be decreased by a factor equivalent to the number of loop iterations for every new iteration. Additionally, as part of another embodiment or the same, the positive threshold voltage shift offset may be decreased by a factor equivalent to the number of loop iterations for every new iteration. In case a joint threshold voltage shift offset may be used, there may be no reason to differentiate between the positive and the negative threshold voltage shift offset and a linear dependency may be used between the number of iterations and the threshold shift value (independent of the direction).

According to another advantageous embodiment, the method may be a component of a background process. Thus, the method may be performed outside the operation functions like read, write and/or erase of the NAND flash memory operations, and may thus not have a negative effect on the operational performance of the memory cells.

According to one possible embodiment of the method, the function used for adjusting the threshold voltage shift value may be given by $$gTVS = gTVS + \text{sign} * n * \Delta, \text{ wherein}$$

sign=a direction of the change, n=number of loop iterations, and Δ=the joint threshold voltage shift offset for the case a joint threshold voltage shift offset may be used. This may represent an easy to implement and fast executable determination scheme.

According to one additionally preferred embodiment of the method, the direction of change may be determined by comparing the maximum raw bit error rate of all selected pages read with gTVS−Δ with the maximum raw bit error rate of all selected pages read with gTVS and the maximum raw bit error rate of all selected pages read with gTVS+Δ. The direction of change is determined by moving into the direction of a lower raw bit error rate.

According to another additionally preferred embodiment of the method, a distance of change is determined by the difference in the maximum raw bit error rate of all selected pages read with gTVS−Δ with the maximum raw bit error rate of all selected pages read with gTVS, and the maximum raw bit error rate of all selected pages read with gTVS+Δ. This way, the stop condition may be reached faster because steps for changing the gTVS may be larger during low iteration numbers. This may help to improve the overall performance due to a reduced maintenance cycle time.

In the following, a detailed description of the figures will be given. All instructions in the figures are schematic. Firstly, a block diagram of an embodiment of the inventive method for optimizing a read threshold voltage shift value in a NAND flash memory is given. Afterwards, further embodiments, as well as embodiments of the memory controller for optimizing a read threshold voltage shift value for a NAND flash memory, will be described.

FIG. 1 shows a block diagram of an embodiment of the computer-implemented method 100 for optimizing a read threshold voltage shift value in a NAND flash memory. The method 100 comprises: selecting, 102, a group of at least one memory pages. Each of the memory pages comprises a plurality of memory cells.

The method 100 comprises further determining, 104, a current threshold voltage shift value (gTVS) and determine, 106, a positive threshold voltage shift offset value (Δ1) and a negative threshold voltage shift offset value (Δ2), and optionally a damping factor ε.

Then, the method 100 comprises repeating, 108, a loop process. The loop process comprising reading, 110, all memory pages in the selected group with read threshold voltage shift values of gTVS, gTVS+Δ1, gTVS+Δ2 and determining, 112, for each of the read threshold shift values the maximum raw bit error rates for the group of memory pages being read.

Furthermore, the loop process comprises determining, 114, a direction of change for the current threshold voltage shift value using the maximum raw bit error rates obtained from reading the memory pages in the selected group with the read threshold voltage shift values gTVS, gTVS+Δ1, and gTVS+Δ2, as well as, determining, 116, a new current threshold voltage shift value by applying a function to the current threshold voltage shift value using as parameters the current threshold voltage, the direction of change and the positive threshold voltage shift value and the negative threshold voltage shift value, and the damping factor ε.

It may be noted that the minimum number of selected pages may be as low as 1. Using the current process technologies, typical page sizes may be, e.g. 2 k, 4 k, 8 k, . . . . It may also be noted that a base gTVS value may be 0 mV and may lay in a range—depending on the manufacturer specification of the memory cells—in the range of e.g., +/−40 mV. The delta or offset values may typically change in the range of e.g., 1 mV . . . 3 mV . . . , just to indicate a sense for the absolute values.

The loop process runs until the stop condition is fulfilled such that the optimizing a read threshold voltage shift value is determined to generate a lowest possible number of read errors per group of memory pages. Other stop conditions may apply, i.e., reaching a maximum number of iteration cycles.

Before discussing specific embodiments of the here proposed concept and for a general understanding in which context the here proposed concept may be implemented advantageously, reference is now made to FIG. 2, in which a block diagram of an exemplary flash memory module 200 is depicted, which may be used to implement the here proposed concept. The flash memory module 200 comprises one or more memory dies, each implementing at least one memory array 202, e.g., formed of 3-D NAND flash memory cells. As indicated in FIG. 2, the memory cells within the memory array 202 are physically arranged in multiple blocks 204, in turn comprising multiple physical pages 206.

As known to those skilled in the art, NAND flash memory, such as that employed in memory array 202, has to be erased prior to being programmed. Further, NAND flash memory can be (but is not required to be) constrained by its architecture, such that the smallest granule of storage that can be erased is a block 204 and the smallest granule of storage that can be accessed by a read or write operation is fixed to the size of a single physical page 206 (as already explained above in another context). It should be appreciated in this regard that the LBAs (logical block address) provided by a host device correspond to logical pages within a logical address space, wherein each logical page typically has a size of e.g., 4 kB (kilobytes). Physical pages 206, in contrast, typically have a larger size, e.g., 16 kB, and can thus correspond to multiple logical pages.

The flash memory module 200 further comprises a row decoder 210, through which word lines of the memory array 202 may be addressed (address line 220) and the column decoder 212, through which bit lines of the memory array 202 may be addressed (address line 218). In addition, the flash memory module 200 comprises a read/write circuit 214 that enables the memory cells of a physical page 206 to be programmed or read in parallel. The flash controller circuitry at 200 additionally comprises a control circuit 205 that provides chip-level control of operations (commands 222, 224) of the memory array 202, including read and write accesses made to physical memory pages 206, erasure of data in blocks 204, and the amplitude, duration and plurality of related voltages applied to the memory array 202. The data input/output to/from the flash memory module 200 may flow along the double arrow 224. It may be helpful to keep this general architecture in mind when referring to the following figures.

FIG. 3 shows a block diagram of a flash card 300 used in a data storage system (not shown). The here proposed concept—either as a method or as a related controller/system—may be implemented on the level of the flash card 300.

The flash card 300 includes a gateway 302 that serves as an interface between the flash card 300 and RAID controllers or host bus adapters (HBA) of the data storage system (not shown). The gateway 302 is coupled to a general-purpose processor (GPP) 304, which can be configured (e.g., by program code) to perform pre-processing on operations received by the gateway 302 and/or to schedule servicing of the operations by the flash card 300. The GPP 304 is coupled to a GPP memory 306 (random access memory/DRAM) that can conveniently buffer data created, reference and or modified by GPP 304 in the cause of its processing or data flowing through the gateway 302 destined for one or more of the flash controllers 308.

The gateway 302 is further coupled to one or more multiple flash controllers 308, each of which controls a respective NAND flash memory system 310 which comprises multiple individually addressable NAND flash memory storage devices 312. The flash controllers 308 can be implemented, for example, by an ASIC (application specific integrated circuit) and/or a FPGA (field programmable gate array), and/or a microprocessor, and each flash controller 308 can have an associated flash controller memory 314 (e.g., DRAM). In embodiments in which flash controllers 308 are implemented with an FPGA, the GPP 304 may program and configure the flash controllers 308 during start-up and data of the higher-level data storage system. After start-up, in general, and operation, the flash controllers 308 receive read and write operations from the gateway 302 that requests to read data stored in the NAND flash memory system 310 and/or to store data in the NAND flash memory system 310. The flash controllers 308 service these operations, for example, by accessing the NAND flash memory system 310 to read or write the requested data from or into the NAND flash memory system 310, or by accessing a memory cache (not illustrated) associated with the NAND flash memory system 310.

The flash controllers 308 implement a flash translation layer (FTL) that provides a logical-to-physical address translation to enable access to specific memory locations within the NAND flash memory system 310. In general, an operation received by the flash controller 308 from a host device, such as a higher-level processor system, contains the logical block address (LBA) at which the data is to be accessed (read or written) and, if a write operation, the write data to be stored to the NAND flash memory system 310. The operation may also specify the amount (or size) of the data to be accessed. Other information may also be communicated depending on the protocol and features supported by the data storage system. The flash translation layer translates LBAs received from a RAID controller into physical addresses assigned to corresponding physical locations in the NAND flash memory system 310. The flash controllers 308 may perform address translations and or store mappings between logical and physical addresses in a logical-to-physical translation data structure, such as a logical-to-physical translation table (LPT), which may conveniently be stored in the flash controller memory 314.

FIG. 4 shows a block diagram of another high-level flow chart 400 of an embodiment of the proposed method 100. The block calibration starts, 402, and the currently addressed page group is selected, 404, as first memory page group for the calibration process. Then, current TVS values are read, 406, in the memory of the flash memory controller. Calibrated TVS values for the page group are determined, 408, and the current TVS values are updated, 410, with the newly calibrated TVS values. Then, the process moves to the next page group, 412. If such a duration has gone through all page groups of a given block—in case of "no" of the determination, 414—the process loops back to a reading of the current TVS values for the next block of pages, 406. In case of "yes" of determination, 414, the block calibration is finished, 416.

FIG. 5 shows a block diagram of a more implementation-near flow chart 500 of an embodiment of the proposed method 100. Again, the page block calibration is started (no reference numeral). The process and the related parameters are initialized, 502: in particular, the current group TVS value gTVS is set to read group TVS value. Additionally, the following values are initialized with start values: TVS step delta $\Delta$, TVS shift factor n, a damping factor $\varepsilon$, a maximum page calibration iteration piter=max_iter (maximum number of allowed iterations per block).

In the following, in cases described, in which the positive threshold voltage shift offset value ($\Delta 1$) and a negative threshold voltage shift offset value ($\Delta 2$) are identical in absolute value, i.e., one 4 value can be used.

All pages in the group of memory pages are read, 504, 3 times with different TVS values as follows: gTVS−$\Delta$, gTVS, gTVS+$\Delta$. The RBER for each page read is obtained. And, the highest RBER across all pages in the group for each of the TVS values mxGrEr(gTVS−$\Delta$), mxGrEr(gTVS), mxGrEr(gTVS+$\Delta$) is determined.

Next, it is determined, 506, whether the stop condition is met, namely if (mxGrEr(gTVS)<=mxGrEr(gTVS−$\Delta$)+$\varepsilon$) and (mxGrEr(gTVS)<=mxGrEr(gTVS+$\Delta$)+$\varepsilon$), wherein mxGrEr describes the group error rate (RBER). The value of $\varepsilon$ is a smaller value compared to any practically possible mxGrEr value (e.g., $\varepsilon$<<mxGrEr) in order to limit the number of iterations for the block calibration process. The $\varepsilon$ value may be seen as damping factor for the block calibration process.

If the stop condition is not met (see 506)—case "no" of determination 506—the direction of change is determined by determination 508, namely by testing the condition "mxGrEr(gTVS−$\Delta$)<=mxGrEr(gTVS+$\Delta$)". In case of "yes", 510, the value of the variable sign is set to "−1", and in case of "no", 512, the value of the variable sign is set to "+", of "yes". Then, the variable "piter" is decremented and the shift sector n is updated, 514. Then, it is determined, 516, whether the maximum number of iterations has been reached, namely whether the condition piter<0 is met. In case of "no", the gTVS value is updated, 518, by applying the formula gTVS=gTVS+sign*n*Δ, and then the process returns to step 504.

In case of "yes" of the determination 506 (whether the maximum number of iterations has been reached) the gTVS value is updated, 520, according to: gTVS=gTVS+sign*n*Δ, and the current gTVS value is the new optimal TVS value for page group, 522.

Also, if in case of the determination 506 that stop condition is fulfilled—case "yes"—the process goes immediately to step 522 of updating the group gTVS.

FIG. 6 shows a diagram 600 of a non-optimized read threshold voltage shift value depending on the number of related read errors. The chart shows the number of read errors depending on discrete TVS values. The discrete value may describe the shift/offset from an initial offset value "0". As it turns out, the number of errors of a read memory page is higher for a TVS value offset by a "0" shift if compared to the number of read errors at a TVS value equal to TVS minus Δ. It further turns out that the number of read errors at a value of TVS minus 2Δ may be close to the minimum number of read errors in the given curve 602. The damping factor may be used to determine a difference between the number of errors at the current TVS value (which is changing during the course of the iterations) and at TVS-Δ value. If the number of read errors and these two TVS values is below the damping factor £, the process is stopped.

It may be noted that the arrow 606 represents a left shift and the dotted line box 604 represents a situation with a window three TVS values. If it turns out in a first duration process that a shift to the left is required (direction of change is "to the left"). The moving window 604 is moved to the left (arrow 606) for the next iteration process step.

FIG. 7 shows a diagram 700 of an optimized read threshold voltage shift value of −2Δ. The middle TVS value in the moving window 704 may represent the best TVS value resulting in the lowest number of read errors of the "number of read errors w.r.t. the TVS value" curve 702.

FIG. 8 shows a block diagram of an embodiment of the inventive memory controller 800 for optimizing a read threshold voltage shift value for a NAND flash memory. This memory controller comprises only the minimum set of features for implementing the proposed system, i.e., memory controller. Components not required for the proposed controller are not explicitly shown.

The newly proposed memory controller 800 for optimizing a read threshold voltage shift value for a NAND flash memory comprises a selection unit 802 adapted for selecting a group of at least one memory pages. Each of the memory pages comprises a plurality of memory cells.

The memory controller 800 also comprises a first determination unit 804 adapted for determining a current threshold voltage shift value (gTVS), and a second determination unit 806 determining a positive threshold voltage shift offset value (Δ1) and a negative threshold voltage shift offset value (Δ2).

A loop control unit 808 is adapted for controlling a read module 810, a first determination module 812, a second determination module 814, and a third determination module 816 until a stop determination unit of the loop control unit 808 is adapted for receiving a stop condition trigger is triggered. Thereby, the read module 810 is adapted for reading all memory pages in the selected group with read threshold voltage shift values of gTVS, gTVS+Δ1 and gTVS+Δ2. The first determination module 810 is adapted for determining for each of the read threshold shift values the maximum raw bit error rates for the group of memory pages being read, and it is also adapted for determining a direction of change for the current threshold voltage shift value using the maximum raw bit error rates obtained from reading the memory pages in the selected group with the read threshold voltage shift values gTVS, gTVS+Δ1, and gTVS+Δ2.

The second determination module 814 is adapted for determining a direction of change for the current threshold voltage shift value using the maximum raw bit error rates obtained from reading the memory pages in the selected group with the read threshold voltage shift values gTVS, gTVS+Δ1, and gTVS+Δ2. And the third determination module 816 is adapted for determining a new current threshold voltage shift value by applying a function to the current threshold voltage shift value using as parameters the current threshold voltage, the direction of change and the positive threshold voltage shift value and the negative threshold voltage shift value, such that the optimizing a read threshold voltage shift value is determined to generate a lowest possible number of read errors per group of memory pages.

Embodiments of the invention may be implemented together with virtually any type of computer, regardless of the platform being suitable for storing and/or executing program code. FIG. 9 shows, as an example, a computing system 900 suitable for executing program code related to the proposed method.

The computing system 900 is only one example of a suitable computer system, and is not intended to suggest any limitation as to the scope of use or functionality of embodiments of the invention described herein, regardless, whether the computer system 900 is capable of being implemented and/or performing any of the functionality set forth hereinabove. In the computer system 900, there are components, which are operational with numerous other general purpose or special purpose computing system environments or configurations. Examples of well-known computing systems, environments, and/or configurations that may be suitable for use with computer system/server 900 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 900 may be described in the general context of computer system-executable instructions, such as program modules, being executed by a computer system 900. Generally, program modules may include routines, programs, objects, components, logic, data structures, and so on that perform particular tasks or implement particular abstract data types. Computer system/server 900 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system/server 900 is shown in the form of a general-purpose computing device. The components of computer system/server 900 may include, but are not limited to, one or more processors or processing units 902, a system memory 904, and a bus 906 that couple various system components including system memory 904 to the processor 902. Bus 906 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 900 typically includes a variety of computer system readable media. Such media may be any available media that is accessible by computer system/server 900, and it includes both, volatile and non-volatile media, removable and non-removable media.

The system memory 904 may include computer system readable media in the form of volatile memory, such as random access memory (RAM) 908 and/or cache memory 910. Computer system/server 900 may further include other removable/non-removable, volatile/non-volatile computer system storage media. By way of example only, a storage system 912 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 906 by one or more data media interfaces. As will be further depicted and described below, memory 904 may include at least one program product having a set (e.g., at least one) of program modules that are configured to carry out the functions of embodiments of the invention.

The program/utility, having a set (at least one) of program modules 916, may be stored in memory 904 by way of example, and not limiting, as well as an operating system, one or more application programs, other program modules, and program data. Each of the operating systems, one or more application programs, other program modules, and program data or some combination thereof, may include an implementation of a networking environment. Program modules 916 generally carry out the functions and/or methodologies of embodiments of the invention, as described herein.

The computer system/server 900 may also communicate with one or more external devices 918 such as a keyboard, a pointing device, a display 920, etc.; one or more devices that enable a user to interact with computer system/server 900; and/or any devices (e.g., network card, modem, etc.) that enable computer system/server 900 to communicate with one or more other computing devices. Such communication can occur via Input/Output (I/O) interfaces 914. Still yet, computer system/server 900 may communicate with one or more networks such as a local area network (LAN), a general wide area network (WAN), and/or a public network (e.g., the Internet) via network adapter 922. As depicted, network adapter 922 may communicate with the other components of computer system/server 900 via bus 906. It should be understood that, although not shown, other hardware and/or software components could be used in conjunction with computer system/server 900. Examples, include, but are not limited to: microcode, device drivers, redundant processing units, external disk drive arrays, RAID systems, tape drives, and data archival storage systems, etc.

Additionally, the memory controller 800 for optimizing a read threshold voltage shift value for a NAND flash memory may be attached to the bus system 906.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present invention may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A computer-implemented method for optimizing a read threshold voltage shift value in a NAND flash memory, said method comprising
   selecting a group of at least one memory pages, each of said memory pages comprising a plurality of memory cells,
   determining a current threshold voltage shift value (gTVS),
   determining a positive threshold voltage shift offset value ($\Delta 1$) and a negative threshold voltage shift offset value ($\Delta 2$),
   repeating a loop process comprising
      reading all memory pages in said selected group with read threshold voltage shift values of gTVS, gTVS+$\Delta 1$, gTVS+$\Delta 2$,
      determining for each of said read threshold shift values said maximum raw bit error rates for said group of memory pages being read,
      determining a direction of change for said current threshold voltage shift value using said maximum raw bit error rates obtained from reading said memory pages in said selected group with said read threshold voltage shift values gTVS, gTVS+$\Delta 1$, and gTVS+$\Delta 2$, determining a new current threshold voltage shift value by applying a function to said current threshold voltage shift value using as parameters said current threshold voltage, said direction of change and said positive threshold voltage shift value and said negative threshold voltage shift value, until a stop condition is fulfilled such that said optimizing a read threshold voltage shift value is determined to generate a lowest possible number of read errors per group of memory pages, wherein said stop condition is fulfilled if said maximum raw bit error rates of all selected pages read with gTVS is smaller than an ε value plus said maximum raw bit error rate of all selected pages read with gTVS+Δ2, or said maximum raw bit error rates of all selected pages read with gTVS is smaller than said value plus said maximum raw bit error rates for gTVS+Δ1.

2. A computer-implemented method for optimizing a read threshold voltage shift value in a NAND flash memory, said method comprising selecting a group of at least one memory pages, each of said memory pages comprising a plurality of memory cells, determining a current threshold voltage shift value (gTVS), determining a positive threshold voltage shift offset value (Δ1) and a negative threshold voltage shift offset value (Δ2), repeating a loop process comprising
reading all memory pages in said selected group with read threshold voltage shift values of gTVS, gTVS+Δ1, gTVS+Δ2, determining for each of said read threshold shift values said maximum raw bit error rates for said group of memory pages being read, determining a direction of change for said current threshold voltage shift value using said maximum raw bit error rates obtained from reading said memory pages in said selected group with said read threshold voltage shift values gTVS, gTVS+Δ1, and gTVS+Δ2, determining a new current threshold voltage shift value by applying a function to said current threshold voltage shift value using as parameters said current threshold voltage, said direction of change and said positive threshold voltage shift value and said negative threshold voltage shift value, until a stop condition is fulfilled such that said optimizing a read threshold voltage shift value is determined to generate a lowest possible number of read errors per group of memory pages, wherein a read operation of a memory page is skipped if said memory page has been read with said same threshold voltage shift values in a previous iteration, and said raw bit error rate from said previous read with said same threshold voltage shift values is used.

3. A computer-implemented method for optimizing a read threshold voltage shift value in a NAND flash memory, said method comprising selecting a group of at least one memory pages, each of said memory pages comprising a plurality of memory cells, determining a current threshold voltage shift value (gTVS), determining a positive threshold voltage shift offset value (Δ1) and a negative threshold voltage shift offset value (Δ2), repeating a loop process comprising
reading all memory pages in said selected group with read threshold voltage shift values of gTVS, gTVS+Δ1, gTVS+Δ2, determining for each of said read threshold shift values said maximum raw bit error rates for said group of memory pages being read, determining a direction of change for said current threshold voltage shift value using said maximum raw bit error rates obtained from reading said memory pages in said selected group with said read threshold voltage shift values gTVS, gTVS+Δ1, and gTVS+Δ2, determining a new current threshold voltage shift value by applying a function to said current threshold voltage shift value using as parameters said current threshold voltage, said direction of change and said positive threshold voltage shift value and said negative threshold voltage shift value, until a stop condition is fulfilled such that said optimizing a read threshold voltage shift value is determined to generate a lowest possible number of read errors per group of memory pages, wherein said function is $gTVS = gTVS + sign*n*\Delta$, wherein sign = a direction of said change,
n = number of loop iterations, and
Δ = said joint threshold voltage shift offset Δ.

4. A computer-implemented method for optimizing a read threshold voltage shift value in a NAND flash memory, said method comprising selecting a group of at least one memory pages, each of said memory pages comprising a plurality of memory cells, determining a current threshold voltage shift value (gTVS), determining a positive threshold voltage shift offset value (Δ1) and a negative threshold voltage shift offset value (Δ2), repeating a loop process comprising
reading all memory pages in said selected group with read threshold voltage shift values of gTVS, gTVS+Δ1, gTVS+Δ2, determining for each of said read threshold shift values said maximum raw bit error rates for said group of memory pages being read, determining a direction of change for said current threshold voltage shift value using said maximum raw bit error rates obtained from reading said memory pages in said selected group with said read threshold voltage shift values gTVS, gTVS+Δ1, and gTVS+Δ2, determining a new current threshold voltage shift value by applying a function to said current threshold voltage shift value using as parameters said current threshold voltage, said direction of change and said positive threshold voltage shift value and said negative threshold voltage shift value, until a stop condition is fulfilled such that said optimizing a read threshold voltage shift value is determined to generate a lowest possible number of read errors per group of memory pages, wherein a joint threshold voltage shift offset Δ corresponds to said positive threshold voltage shift offset Δ1 and said negative of said negative threshold voltage shift offset Δ2; and wherein said direction of change is determined by comparing said maximum raw bit error rate of all selected pages read with gTVS−Δ with said maximum raw bit error rate of all selected pages read with gTVS, and said maximum raw bit error rate of all selected pages read with gTVS+Δ.

5. A computer-implemented method for optimizing a read threshold voltage shift value in a NAND flash memory, said method comprising selecting a group of at least one memory pages, each of said memory pages comprising a plurality of memory cells, determining a current threshold voltage shift value (gTVS), determining a positive threshold voltage shift offset value (Δ1) and a negative threshold voltage shift offset value (Δ2), repeating a loop process comprising reading all memory pages in said selected group with read threshold voltage shift values of gTVS, gTVS+Δ1, gTVS+Δ2, determining for each of said read threshold shift values said maximum raw bit error rates for said group of memory pages being read, determining a direction of change for said current threshold voltage shift value using said maximum raw bit error rates obtained from reading said memory pages in said selected group with said read threshold voltage shift values gTVS, gTVS+Δ1, and gTVS+Δ2, determining a new current threshold voltage shift value by applying a function to said current threshold voltage shift value using as parameters said current threshold voltage, said direction of change and said positive threshold voltage shift value and said negative threshold voltage shift value, until a stop condition is fulfilled such that said optimizing a read threshold voltage shift value is determined to generate a lowest possible number of read errors per group of memory pages, wherein a joint threshold voltage shift offset Δ corresponds to said positive threshold voltage shift offset Δ1 and said negative of said negative threshold voltage shift offset Δ2; and wherein a distance of change is determined by said difference in said maximum raw bit error rate of all selected pages read with gTVS−Δ with said maximum raw bit error rate of all selected pages read with gTVS, and said maximum raw bit error rate of all selected pages read with gTVS+4.

6. A memory controller for optimizing a read threshold voltage shift value for a NAND flash memory, said system comprising a selection unit adapted for selecting a group of at least one memory pages, each of said memory pages comprising a plurality of memory cells, a first determination unit adapted for determining a current threshold voltage shift value (gTVS), a second determination unit determining a positive threshold voltage shift offset value (Δ1) and a negative threshold voltage shift offset value (Δ2), a loop control unit adapted for controlling a read module, a first determination module, a second determination module and a third determination module until a stop determination unit adapted for receiving a stop condition trigger is triggered, wherein said read module is adapted for reading all memory pages in said selected group with read threshold voltage shift values of gTVS, gTVS+Δ1, gTVS+Δ2 wherein said first determination module is adapted for determining for each of said read threshold shift values said maximum raw bit error rates for said group of memory pages being read, and adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said second determination module is adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said third determination module is adapted for determining a new current threshold voltage shift value by applying a function to said current threshold voltage shift value using as parameters said current threshold voltage, said direction of change and said positive threshold voltage shift value and said negative threshold voltage shift value, such that said optimizing a read threshold voltage shift value is determined to generate a lowest possible number of read errors per group of memory pages, wherein said stop condition trigger is triggerable if said maximum raw bit error rates of all selected pages read with gTVS is smaller than an ε value plus said maximum raw bit error rate of all selected pages read with gTVS+Δ2, or said maximum raw bit error rates of all selected pages read with gTVS is smaller than said value plus said maximum raw bit error rates for gTVS+Δ1.

7. A memory controller for optimizing a read threshold voltage shift value for a NAND flash memory, said system comprising a selection unit adapted for selecting a group of at least one memory pages, each of said memory pages comprising a plurality of memory cells, a first determination unit adapted for determining a current threshold voltage shift value (gTVS), a second determination unit determining a positive threshold voltage shift offset value (Δ1) and a negative threshold voltage shift offset value (Δ2), a loop control unit adapted for controlling a read module, a first determination module, a second determination module and a third determination module until a stop determination unit adapted for receiving a stop condition trigger is triggered, wherein said read module is adapted for reading all memory pages in said selected group with read threshold voltage shift values of gTVS, gTVS+Δ1, gTVS+Δ2 wherein said first determination module is adapted for determining for each of said read threshold shift values said maximum raw bit error rates for said group of memory pages being read, and adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said second determination module is adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said third determination module is adapted for determining a new current threshold voltage shift value by applying a function to said current threshold voltage shift value using as parameters said current threshold voltage, said direction of change and said positive threshold voltage shift value and said negative threshold voltage shift value, such that said optimizing a read threshold voltage shift value is determined to generate a lowest possible number of read errors per group of memory pages, wherein said read module is also adapted for skipping a read operation of a memory page if said memory page has been read with said same threshold voltage shift values in a previous iteration, and said raw bit error rate from said previous read with said same threshold voltage shift values is used.

8. A memory controller for optimizing a read threshold voltage shift value for a NAND flash memory, said system comprising a selection unit adapted for selecting a group of at least one memory pages, each of said memory pages comprising a plurality of memory cells, a first determination unit adapted for determining a current threshold voltage shift value (gTVS), a second determination unit determining a positive threshold voltage shift offset value (Δ1) and a negative threshold voltage shift offset value (Δ2), a loop control unit adapted for controlling a read module, a first determination module, a second determination module and a third determination module until a stop determination unit adapted for receiving a stop condition trigger is triggered, wherein said read module is adapted for reading all memory pages in said selected group with read threshold voltage shift values of gTVS, gTVS+Δ1, gTVS+Δ2 wherein said first determination module is adapted for determining for each of said read threshold shift values said maximum raw bit error rates for said group of memory pages being read, and adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said second determination module is adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said third determination module is adapted for determining a new current threshold voltage shift value by applying a function to said current threshold voltage shift value using as parameters said current threshold voltage, said direction of change and said positive threshold voltage shift value and said negative threshold voltage shift value, such that said optimizing a read threshold voltage shift value is determined to generate a lowest possible number of read errors per group of memory pages, wherein a joint threshold voltage shift offset Δ corresponds to said positive threshold voltage shift offset Δ1 and said negative of said negative threshold voltage shift offset Δ2, and wherein said function is $$gTVS = gTVS + sign * n * \Delta, \text{ wherein}$$

sign=said direction of said change
n=number of loop iterations, and
Δ=joint threshold voltage shift offset.

9. A memory controller for optimizing a read threshold voltage shift value for a NAND flash memory, said system comprising a selection unit adapted for selecting a group of at least one memory pages, each of said memory pages comprising a plurality of memory cells, a first determination unit adapted for determining a current threshold voltage shift value (gTVS), a second determination unit determining a positive threshold voltage shift offset value (Δ1) and a negative threshold voltage shift offset value (Δ2), a loop control unit adapted for controlling a read module, a first determination module, a second determination module and a third determination module until a stop determination unit adapted for receiving a stop condition trigger is triggered, wherein said read module is adapted for reading all memory pages in said selected group with read threshold voltage shift values of gTVS, gTVS+Δ1, gTVS+Δ2 wherein said first determination module is adapted for determining for each of said read threshold shift values said maximum raw bit error rates for said group of memory pages being read, and adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said second determination module is adapted for determining a direction of change for said current threshold voltage shift value using said maximum raw bit error rates obtained from reading said memory pages in said selected group with said read threshold voltage shift values gTVS, gTVS+Δ1, and gTVS+Δ2, wherein said third determination module is adapted for determining a new current threshold voltage shift value by applying a function to said current threshold voltage shift value using as parameters said current threshold voltage, said direction of change and said positive threshold voltage shift value and said negative threshold voltage shift value, such that said optimizing a read threshold voltage shift value is determined to generate a lowest possible number of read errors per group of memory pages, wherein a joint threshold voltage shift offset Δ corresponds to said positive threshold voltage shift offset Δ1 and said negative of said negative threshold voltage shift offset Δ2, and wherein said second determination module is also adapted for determining said direction of change by comparing said maximum raw bit error rate of all selected pages read with gTVS−Δ with said maximum raw bit error rate of all selected pages read with gTVS, and said maximum raw bit error rate of all selected pages read with gTVS+Δ and/or wherein said third determination module is adapted for determining a distance of change by said difference in said maximum raw bit error rate of all selected pages read with gTVS−Δ with said maximum raw bit error rate of all selected pages read with gTVS, and said maximum raw bit error rate of all selected pages read with gTVS+Δ.

\* \* \* \* \*